(12) United States Patent
Yasui et al.

(10) Patent No.: US 8,373,943 B2
(45) Date of Patent: Feb. 12, 2013

(54) MAGNETIC HEAD HAVING A MULTILAYER MAGNETIC FILM AND METHOD FOR PRODUCING THE SAME

(75) Inventors: Kan Yasui, Kodaira (JP); Nobuo Yoshida, Hiratsuka (JP); Katsuro Watanabe, Hitachiohta (JP); Norihiro Okawa, Odawara (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 291 days.

(21) Appl. No.: 12/941,953

(22) Filed: Nov. 8, 2010

(65) Prior Publication Data

US 2011/0116184 A1    May 19, 2011

(30) Foreign Application Priority Data

Nov. 17, 2009    (JP) .................................. 2009-262231

(51) Int. Cl.
*G11B 5/127*    (2006.01)
(52) U.S. Cl. ........................................................ 360/110
(58) Field of Classification Search .................. 360/110, 360/290, 125.04, 234.3, 235.4, 324, 234.6; 29/603.07, 603.13
See application file for complete search history.

(56) References Cited

U.S. PATENT DOCUMENTS

| | | | |
|---|---|---|---|
| 6,906,898 B2 | 6/2005 | Kawato | |
| 7,768,741 B2* | 8/2010 | Feng | 360/125.03 |
| 2004/0233578 A1* | 11/2004 | Gao | 360/125 |
| 2007/0268623 A1* | 11/2007 | Feng | 360/126 |
| 2008/0232001 A1* | 9/2008 | Bonhote et al. | 360/319 |
| 2009/0034135 A1 | 2/2009 | Hoshiya et al. | |
| 2011/0135959 A1* | 6/2011 | Hong | 428/810 |

FOREIGN PATENT DOCUMENTS

| | | |
|---|---|---|
| JP | 2002/305336 A | 10/2002 |
| JP | 3760095 B2 | 3/2006 |
| JP | 2009/026400 A | 2/2009 |
| JP | 2009/087474 A | 4/2009 |

OTHER PUBLICATIONS

Zhu et al., "Bias-Field-Free Microwave Oscillator Driven by Perpendicularly Polarized Spin Current," © 2006 IEEE, IEEE Transactions on Magnetics, vol. 42, No. 10, Oct. 2006, p. 2670-2672.

* cited by examiner

*Primary Examiner* — Allen Cao
(74) *Attorney, Agent, or Firm* — Zilka-Kotab, PC

(57) ABSTRACT

According to one embodiment, a method for producing a magnetic head includes depositing a first film above a substrate, etching a pattern into the first film, depositing a second film on the etched portion of the first film, and depositing a third film above the first and second film to form a multilayer magnetic film, wherein the second film is embedded between the first and third film in a portion of the first film that is removed. In another embodiment, a differential magnetic read head includes a magnetic multilayer film comprising a stack of a first magnetic sensor film and a second magnetic sensor film which are not magnetically connected and a hard magnetic film provided on both sides in a track width direction of the magnetic multilayer film for controlling a magnetic domain of the magnetic multilayer film. The hard magnetic film is a laminated structure as described above.

25 Claims, 20 Drawing Sheets

MAGNETIC HEAD HAVING A MULTILAYER MAGNETIC FILM AND METHOD FOR PRODUCING THE SAME

RELATED APPLICATIONS

The present application claims priority to a Japanese Patent Application filed Nov. 17, 2009, under Appl. No. 2009-262231, which is incorporated herein by reference.

FIELD OF THE INVENTION

The present invention relates to a magnetic recording head having a multilayer magnetic film which is mounted in a magnetic recording/playback device, and to a method for producing the magnetic recording head.

BACKGROUND OF THE INVENTION

The size of magnetic heads has reduced over time with the aim of increasing a recording density of the magnetic disk in hard disk drives (HDDs). Induction heads which employ a combined recording head and read head typically were widespread in the industry, but a more current trend is toward separating the recording head and the read head in a separate recording/read head design in order to improve performance of the head. The recording head may be an induction head for writing information using an induced magnetic field produced by a coil, while the read head used may be a giant magnetoresistive (GMR) head or a tunnel magnetoresistive (TMR) head.

FIG. 2 shows a schematic of a separate recording/playback-type head comprising a recording head part 1 and a read head part 2. Furthermore, FIG. 3 shows an enlarged view of the read head portion. FIG. 3 is a view seen from the surface facing the magnetic disk medium also known as the air bearing surface (ABS), and corresponds to a view seen from A in FIG. 2. TW is the dimension in the track width direction of the read head part 2. The magnetic head is formed on a substrate, possibly comprising alumina-titanium carbide ($Al_2O_3$—TiC, referred to below as AlTiC) which may be produced using microfabrication technology. It should be noted that the substrate portion has been omitted in the figures, since it is a consistent feature which does not change during processing of the magnetic head. A lower magnetic shield layer 3 and an upper magnetic shield layer 4 possibly comprising permalloy both play a dual role as electrodes, and magnetism is detected when a multilayer spin valve-type magnetoresistive film 5 formed therebetween is energized. An insulating film 11, possibly comprising alumina, may be used at the portion where the magnetoresistive film 5 is isolated, and a hard bias film 6 for applying a bias field may be disposed adjacent thereto.

Various new technologies for magnetic heads have been introduced that attempt to provide an improvement to the recording density of HDDs. One such technology is the differential read head structure shown in FIG. 4, which was proposed with the aim of improving the magnetic field detection performance (resolution) in the bit length direction of the read head. The differential read head has a configuration in which two spin-valve elements are connected in series, and the respective spin valves change the parity of the total number of exchange-couplings in the fixing layer in such a way that the polarity of the magnetic resistance is reversed. As a result, the polarity of the output of the two elements connected in series is reversed, and the differential signals shown schematically in FIG. 4 are output. The detection sensitivity for the magnetic transition of a medium increases the narrower the magnetic shield gap ($G_S$ in FIG. 3) with a normal spin valve. It is difficult to shorten this gap, particularly when it is less than the thickness of the spin valve (less than or equal to about 25 nm), but in the case of a differential read head, it is known that the distance between two magnetic detection layers ($G_L$ in FIG. 4) is a governing factor, and that it is possible to improve resolution because this distance can be freely shortened, as described in detail in Japanese Patent No. 3760095.

The structure shown here constitutes a dual element-type differential head structure in which spin valves of the same type are arranged in series, but an AFC-type structure (anti-ferro coupling, as described in detail in Japanese Unexamined Patent Appl. No. 2009-26400) in which the magnetic detection layers are antiferromagnetically coupled, and a differential structure in which the two elements are connected in parallel has also been considered. In either case, at least two layers are needed for the magnetic detection layer, compared with a normal single-layer spin valve, and therefore the magnetic layer becomes thicker. Due to these factors, the difficulty of processing the dual element-type differential head increases, which constitutes a major difference in production between this type of head and more conventional heads.

Another technology that attempts to increase the recording density of HDDs is the microwave-assisted magnetic recording (MAMR) element, shown in FIG. 5, which was proposed in order to improve the performance of the recording head. The MAMR element has a similar structure to a read head, as disclosed in Xiaochun Zhu and Jian-Gang Zhu, *Bias Field Free Microwave Oscillator Driven by Perpendicularly Polarized Spin Current*, IEEE trans. Magn., 42, No. 10 (2006). A spin polarization current is created in the magnetic layers of the reference layer 20 in FIG. 5, spin torque is used to cause oscillation in a microwave generation layer 19 (FGL, field generation layer), and high-frequency electromagnetic waves (microwaves) may be produced. An auxiliary layer 18, etc., may be provided, depending on the configuration.

One next-generation technology for high recording density involves local irradiation of microwaves, and induction of magnetization precession in the medium so that it is possible to assist in the magnetization inversion in the recording head field, and therefore it is possible to compensate for minute insufficiencies in the recording head field, while it is also possible to make use of a medium material with strong heat fluctuation resistance. The structure of the MAMR element comprises multilayers of magnetic film, as shown in FIG. 5, and it has been calculated that the microwave generation layer 19 should be at least 25 nm in order to generate a high-frequency magnetic field of the desired intensity, and the process for making a thick magnetic film is a key point in terms of production, in the same way as for the differential read head described above.

SUMMARY OF THE INVENTION

According to one embodiment, a method for producing a magnetic head includes depositing a first film above a substrate, etching a pattern into the first film, depositing a second film on the etched portion of the first film, and depositing a third film above the first and second film to form a multilayer magnetic film, wherein the second film is embedded between the first film and the third film in a portion of the first film that is removed, wherein a taper height (k) of a side wall flared portion of the multilayer magnetic film and an overall thickness (x) of the first film and second film at a planar portion adhere to x>2k.

According to another embodiment, a differential magnetic read head includes a magnetic multilayer film comprising a stack of a first magnetic sensor film and a second magnetic sensor film which are not magnetically connected and a hard magnetic film provided on both sides in a track width direction of the magnetic multilayer film for controlling a magnetic domain of the magnetic multilayer film. The hard magnetic film is a laminated structure including a first embedded film having a film surface that has been etched back, and a second embedded film deposited on the film surface that has been etched back on the first embedded film. Differential signals of the first magnetic sensor film and the second magnetic sensor film are output.

In another embodiment, an energy-assisted magnetic recording head includes a multilayer magnetic film having a laminated structure having at least: a first magnetic layer for generating a spin polarization current and a second magnetic layer for generating microwaves using spin torque of a spin polarization current. The head also includes a pole for generating a recording field and an embedded film formed adjacent to the multilayer magnetic film. The embedded film has a laminated structure having: a first embedded film in which a film surface has been etched back, and a second embedded film deposited on the film surface that has been etched back on the first embedded film.

Any of these embodiments may be implemented in a magnetic data storage system such as a disk drive system, which may include a magnetic head, a drive mechanism for passing a magnetic medium (e.g., hard disk) over the magnetic head, and a controller electrically coupled to the magnetic head.

Other aspects and advantages of the present invention will become apparent from the following detailed description, which, when taken in conjunction with the drawings, illustrate by way of example the principles of the invention.

DETAILED DESCRIPTION

Figure 1:
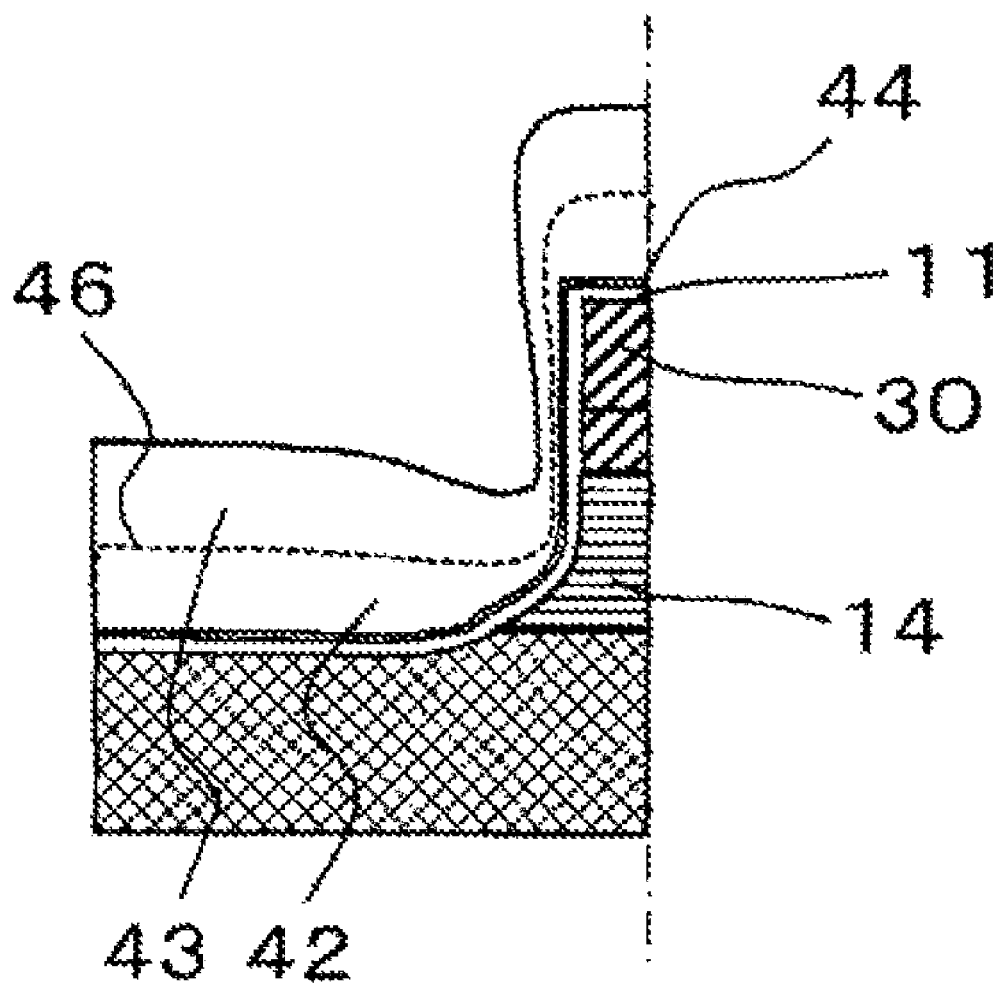
FIG. 1 illustrates a first exemplary embodiment of a portion of a magnetic head.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

According to one general embodiment, a method for producing a magnetic head includes depositing a first film above a substrate, etching a pattern into the first film, depositing a second film on the etched portion of the first film, and depositing a third film above the first and second film to form a multilayer magnetic film, wherein the second film is embedded between the first film and the third film in a portion of the first film that is removed.

According to another general embodiment, a differential magnetic read head includes a magnetic multilayer film comprising a stack of a first magnetic sensor film and a second magnetic sensor film which are not magnetically connected and a hard magnetic film provided on both sides in a track width direction of the magnetic multilayer film for controlling a magnetic domain of the magnetic multilayer film. The hard magnetic film is a laminated structure including a first embedded film having a film surface that has been etched back, and a second embedded film deposited on the film surface that has been etched back on the first embedded film. Differential signals of the first magnetic sensor film and the second magnetic sensor film are output.

In another general embodiment, an energy-assisted magnetic recording head includes a multilayer magnetic film having a laminated structure having at least: a first magnetic layer for generating a spin polarization current and a second magnetic layer for generating microwaves using spin torque of a spin polarization current. The head also includes a pole for generating a recording field and an embedded film formed adjacent to the multilayer magnetic film. The embedded film has a laminated structure having: a first embedded film in which a film surface has been etched back, and a second embedded film deposited on the film surface that has been etched back on the first embedded film.

An issue involving the production of differential read heads and MAMR elements becomes apparent when working with magnetic films that are thicker than normal, e.g., about 40 nm to about 80 nm. The process flowchart for producing a differential read head is shown in FIGS. 6-9 for the purposes of the following descriptions, according to one embodiment.

Figure 6:
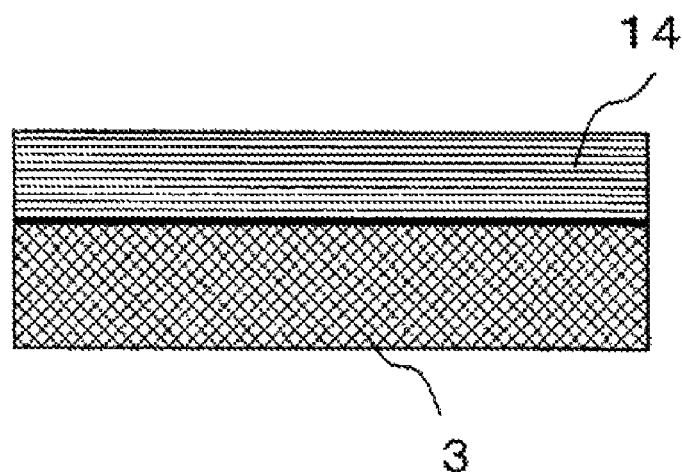
FIG. 6 schematically illustrates the flow process for producing a differential playback magnetic head, according to one embodiment.

FIGS. 6-9 schematically show a process flowchart in which the read head on an AlTiC substrate has been enlarged, according to one embodiment. Each figure is a cross sectional view as seen from the air bearing surface (ABS). FIG. 6 shows the stage in which a lower magnetic shield layer 3 made of permalloy is formed, and a magnetoresistive film 14 having a differential structure is formed thereon.

Figure 7:
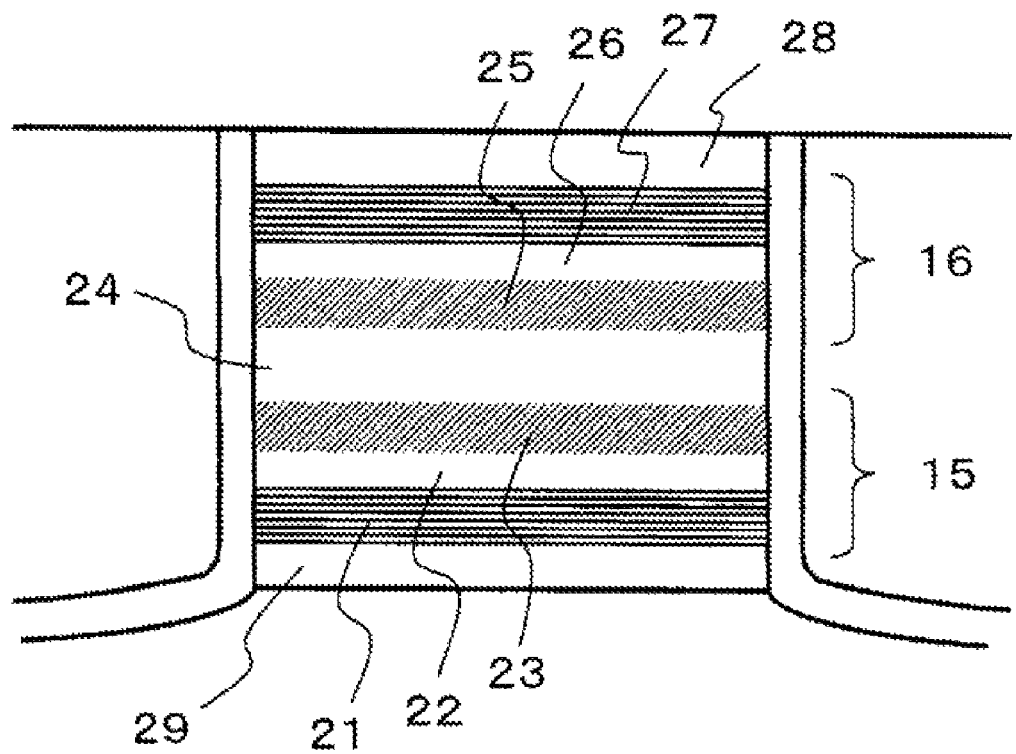
FIG. 7 illustrates a different structure having the function of the magnetoresistive film of the differential playback magnetic head, according to one embodiment.

A different structure having the function of the magnetoresistive film 14 is shown in FIG. 7, according to another embodiment. A lower element 15 may have a structure in which an underlayer 29, fixing layer 21, insulating layer 22, and free layer 23 are stacked in succession in the same way as a normal spin valve, according to another embodiment. A free layer 25, insulating layer 26, and fixing layer 27 of an upper element 16 may be stacked in an arrangement which is the reverse of the lower side, with the interposition of a non-magnetic interlayer 24 such as tantalum or ruthenium, in another embodiment. A cap layer 28 may be formed on the fixing layer 27. A TMR film may be used for the spin valve, but it is equally possible to employ a CPP-GMR film. When a CPP-GMR film is employed, the insulating layers 22 and 26 may be rearranged as interlayers.

Figure 8:
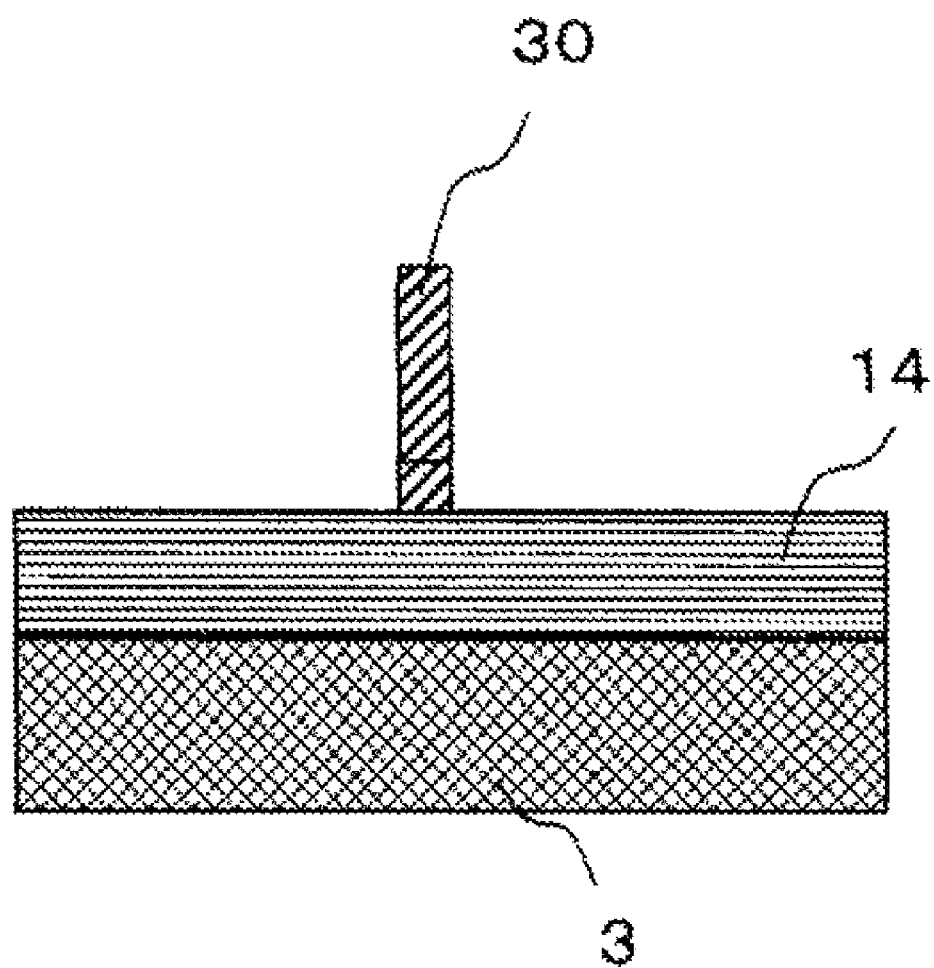
FIG. 8 schematically illustrates a process flowchart for producing a differential playback magnetic head, as a continuation of FIG. 6, according to one embodiment.
Figure 9:
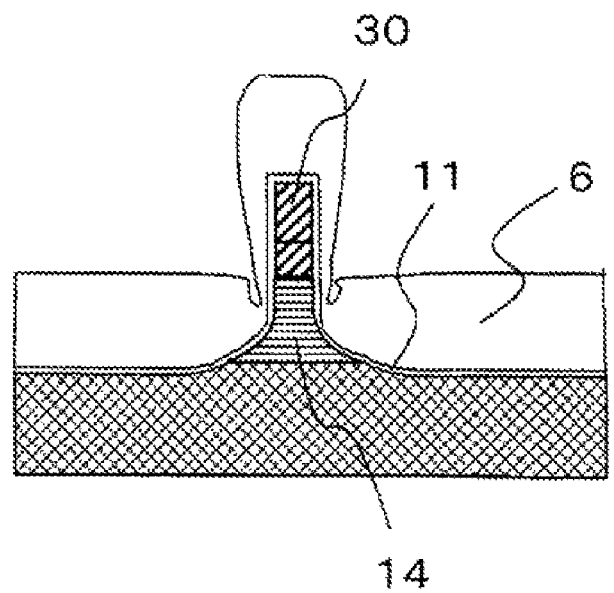
FIG. 9 schematically illustrates the process flowchart for producing a differential playback magnetic head, as a continuation of FIG. 8, according to one embodiment.

The track width pattern is formed next. As shown in FIG. 8, the track width pattern may be formed by a photoresist and polyimide laminated mask 30 using photolithography. This is transferred to the element by ion milling, according to another embodiment. The unneeded magnetoresistive film is then removed, after which a thin alumina film 11 which serves as an insulating film for the magnetoresistive film side walls, and a hard bias film 6 (permanent magnet) may be deposited, according to another embodiment, to produce the structure shown in FIG. 9. The hard bias film 6 has the role of a permanent magnet which applies a bias field to the magnetoresistive element, and an alloy film, such as cobalt/chromium/platinum, for example, may be used for this film.

Figure 10:
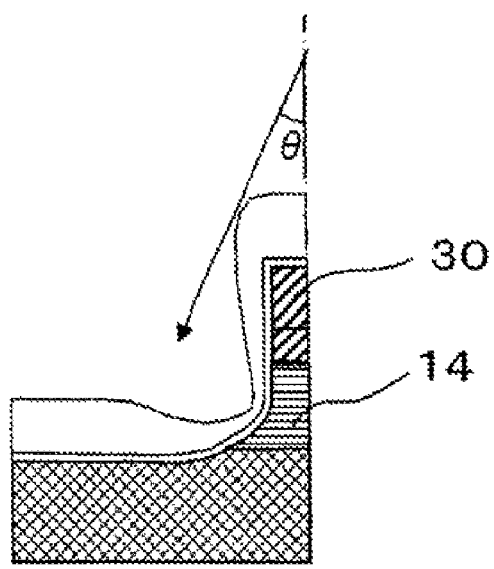
FIG. 10 schematically illustrates an issue of the process for producing a thick-film element such as the differential playback magnetic head, according to one embodiment.
Figure 11:
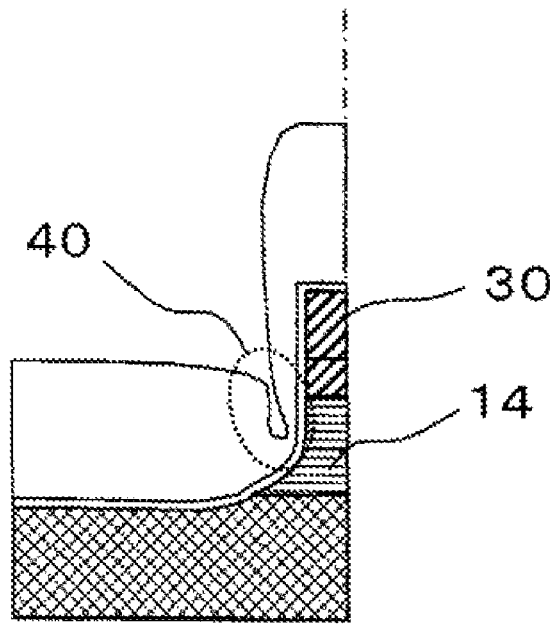
FIG. 11 schematically illustrates an issue of the process for producing a thick-film element, such as the differential playback magnetic head, according to one embodiment.

In the case of a differential read head, the magnetoresistive film 14 may be close to twice the thickness of that of a normal read head, and therefore the following problem is created at this stage since an equivalent thickness is also imparted to the refill hard bias film, according to another embodiment. As shown in FIG. 10, the refill hard bias film is thinned in the region of the side walls of the magnetoresistive film by an effect whereby the beam from ion beam deposition shadows the track pattern. The degree of thinning also depends on the angle of incidence and the state of divergence of the ion beam, but the thickness in the region of the side walls is generally around half that of the flat portion where there is no pattern to form a shadow, according to another embodiment. As the deposition of the hard bias film progresses, there is the added effect of the protrusion of the film which adheres to the side walls, and the open angle from the region of the side walls becomes even narrower. In the stage where the thick portion of the thick magnetoresistive film 14 is refilled, a void 40 or a seam is formed at the portion of the hard bias film in the region of the side walls, as shown in FIG. 11, according to another embodiment. The magnetic characteristics of the magnetoresistive film may deteriorate at the void or seam portion, and there is a strong possibility that the hard bias field will not be applied in accordance with the design, which may also cause corrosion of the film, according to another embodiment, and therefore it is preferred to avoid formation of a void or seam. The magnetic field from the hard bias film is strongly affected in the region of the magnetoresistive film in particular, and therefore if there is a void or seam there, the hard bias field is not strong enough, which is a problem, according to another embodiment.

Figure 12:
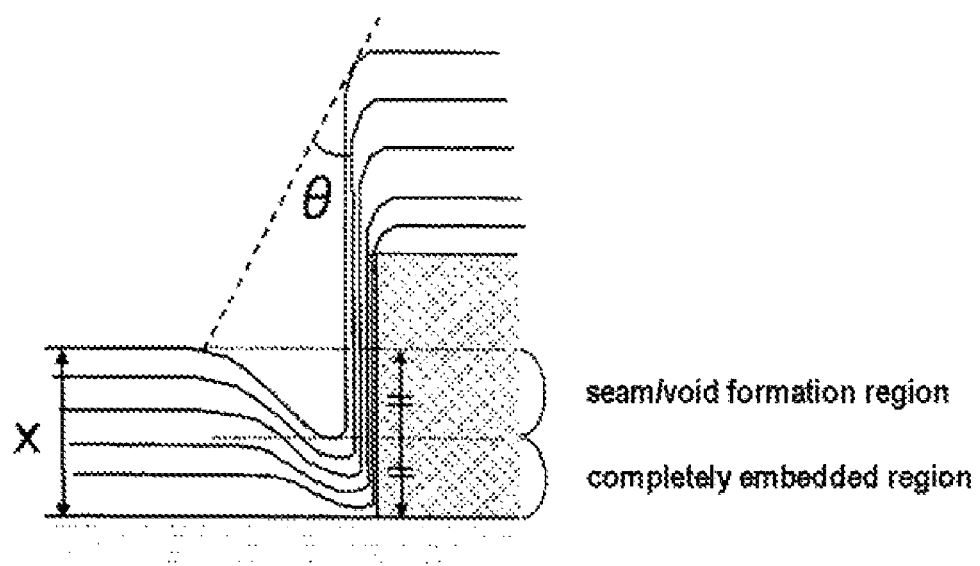
FIG. 12 schematically illustrates the formation of voids and seams at the side wall where the pattern is formed, according to one embodiment.

A void or seam is generally more likely to be formed as the thickness of the deposition on the side walls where the pattern is formed is increased. This situation is shown in simplified form in FIG. 12, according to another embodiment. Ions from ion beam milling having an angle of incidence θ are blocked in the region of the pattern by the pattern, according to another embodiment, and the shadowing effect causes the thickness of the deposited film to become thinner in the region of the pattern. A certain amount of film may also be deposited on the pattern side walls at the same time, and therefore a recess is formed in the region of the pattern, according to another embodiment. As the film deposition progresses, the open angle from the recess becomes steadily narrower, and when the ion beam entrance is closed off, this may finally lead to a void or seam. If the thickness of deposition on the planar portion is x, then the height of the film surface in the region of the side walls is approximately x/2 (a possible reason for this is described later).

Figure 13:
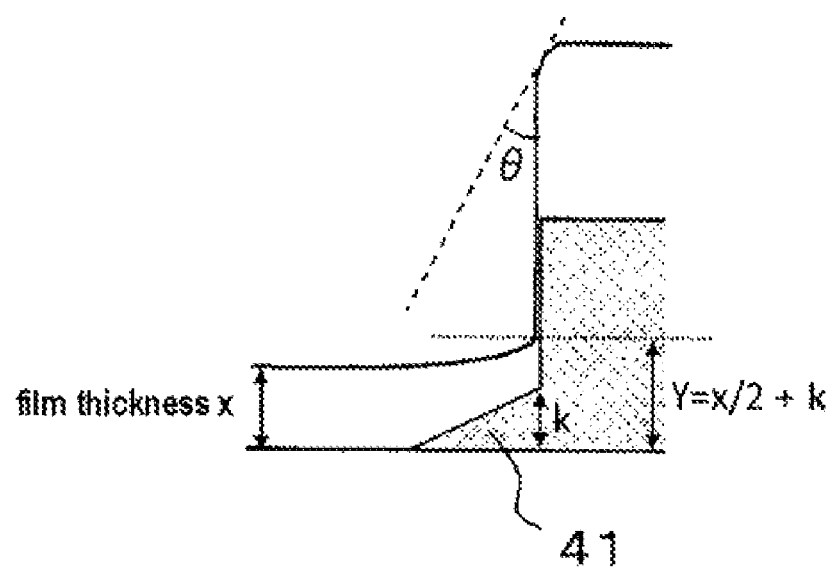
FIG. 13 illustrates the state of film deposition on the pattern side wall when the flared portion is present, according to one embodiment.
Figure 14:
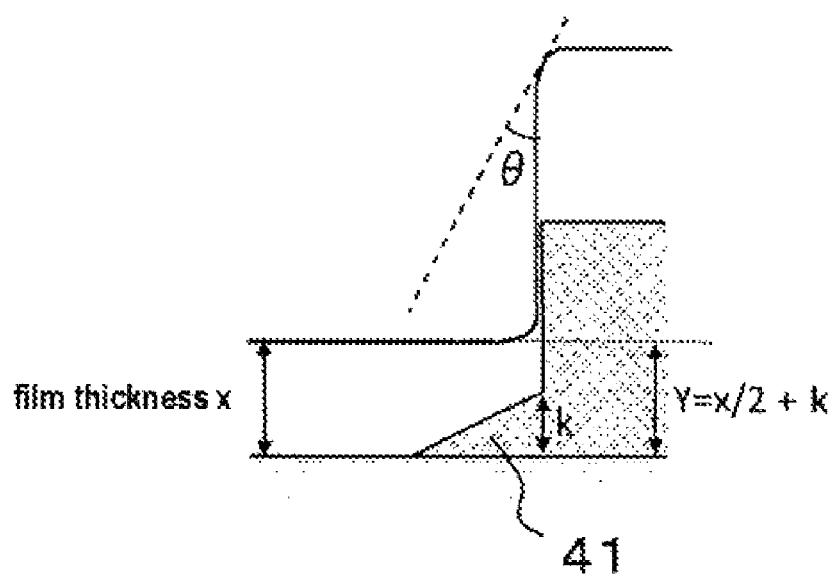
FIG. 14 illustrates the state of film deposition on the pattern side wall when the flared portion is present, according to one embodiment.
Figure 15:
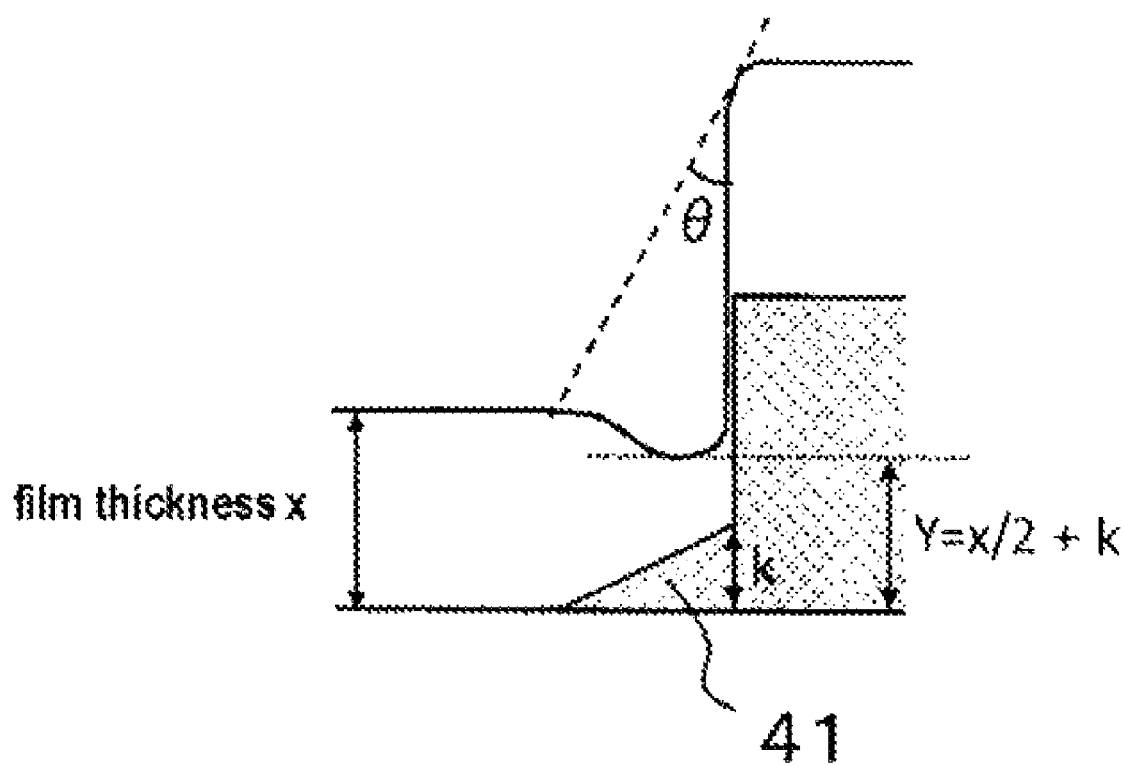
FIG. 15 illustrates the state of film deposition on the pattern side wall when the flared portion is present, according to one embodiment.

In practice, and as shown in FIG. 13, a flared portion 41 may be produced on the film which forms the pattern (the magnetoresistive film in the case of a differential head) when ion milling is used, according to another embodiment. The state of deposition when the flared portion is present will be described with the aid of FIG. 13-15. For reasons of simplicity, the height of the triangular taper of the flared portion 41 is designated as k. In an actual element, an adequate approximation is obtained if the distance XY=k, taking as a reference the point of intersection X between the line of extension A extending from the flat surface which is remote from the element part parallel to the substrate surface, and the line of extension B which is parallel to the side wall surface extending from the top end of the element, and using the point of intersection Y between the lines B and C wherein a 50% section or less in the region of the element within the flared portion is close to linear, according to one embodiment. When the flared portion is large and occupies the entire element side wall, the height at the side wall part may be considered simply as k. If the thickness of deposition at the planar portion is x, the height of the film surface in the region of the side wall is x/2+k, according to one embodiment. The states in FIGS. 13-15 are in accordance with the magnitude relationship between the thickness x of deposition on the planar portion and the height x/2+k of the film surface in the side wall region, according to one embodiment. FIG. 13 shows the case in which x<x/2+k, FIG. 14 shows the case in which x=x/2+k, and FIG. 15 shows the case in which x>x/2+k. The possibility of a void or seam forming means that when the relationship shown in FIG. 15 occurs, in which the film thickness in the side wall region is less than that of the planar portion and a recess is formed, the open angle from the recess becomes narrower as the film deposition progresses so that a void or seam is formed if the ion beam entrance is closed off, according to one embodiment.

Figure 16:
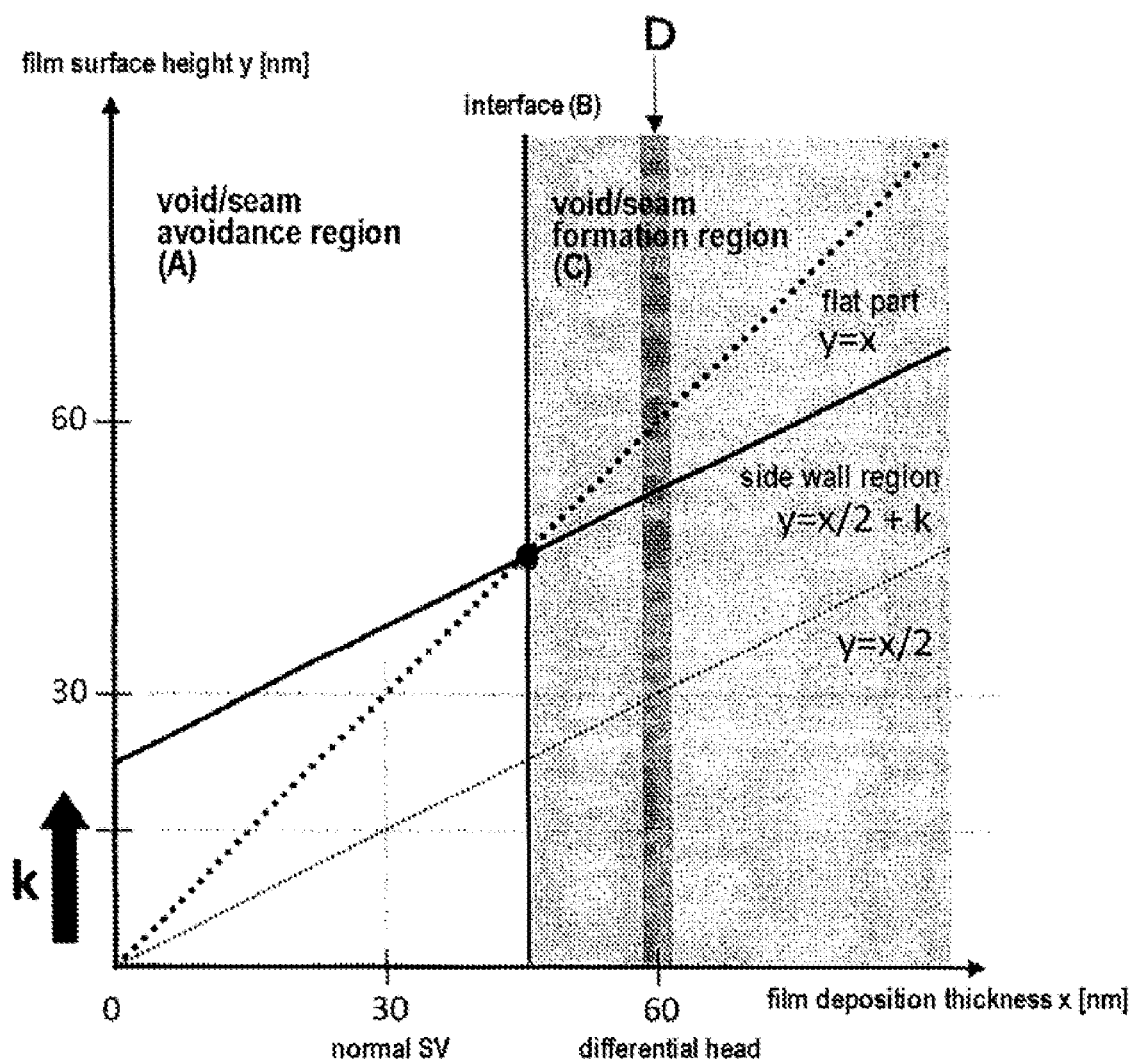
FIG. 16 is an illustration in which the void/seam formation region is generalized on the basis of the film deposition thickness and the film surface height from the substrate surface, according to one embodiment.

If the relations shown in FIG. 13-15 are generalized using a thickness (x) of film deposition, the height (y) of the film surface from the substrate surface, and the taper height (k) of the flared portion, the structure appears as shown in FIG. 16. This figure is a relationship diagram representing the thickness of the hard bias film which is deposited and the readiness with which a void or seam is formed, according to one embodiment. If the point of intersection x=2k between the line y=x representing the height of the film surface on the planar portion, and the line y=x/2+k representing the height of the film surface in the pattern side wall region, is taken as the interface, then x<2k constitutes the void/seam avoidance region (A), x=2k constitutes the interface (B), and x>2k constitutes the region (C) where there is a possibility of a void or seam forming, and these correspond to FIGS. 13, 14, and 15, respectively.

In the case of a differential read head, the film thickness is typically on the order of 60 nm, and when this film is processed by ion beam milling, the taper height of the flared portion k is about 20 nm-25 nm, depending on the conditions. This means that when the hard bias film is deposited to x>2k, e.g., about 40 nm-50 nm, there is a possibility of void or seam formation. On the other hand, a uniform hard bias should be applied to the two magnetic detection layers in the film in a differential read head, and the thickness of the hard bias film should be at least 60 nm, which is the thickness of the magnetoresistive film 14. The line D which shows this condition in FIG. 16 lies in the void/seam formation region (C), and therefore it is clear that some kind of countermeasure is needed.

For the purposes of comparison, this was investigated for a normal spin valve, wherein the thickness of the magnetoresistive film was around 30 nm, the taper height in the flared portion (k) was about 15 nm-30 nm, depending on the ion milling conditions, and the thickness (x) of the hard bias film was around 30 nm, and it was found to lie in the void/seam avoidance region (A) in which x≦2k with respect to the void/seam formation interface where 2k=30 nm-60 nm, and the problems seen in differential read heads did not arise.

Figure 17:
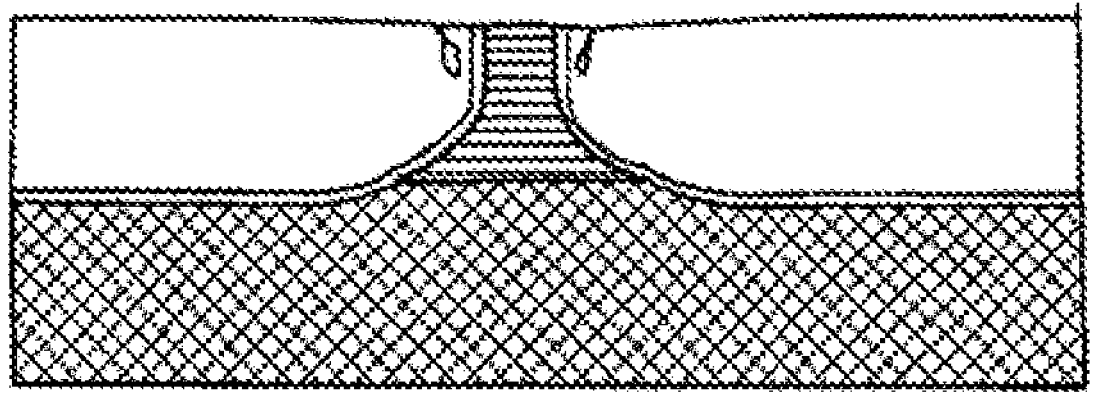
FIG. 17 schematically illustrates the process flowchart for producing the differential playback magnetic head, as a continuation of FIG. 9, according to one embodiment.

It should be noted that, in relation to the process flow, the state shown in FIG. 17 is subsequently achieved when the photoresist on top of the magnetoresistive film, and the insulating film and hard bias film are removed by lift-off, and the basic structure of the playback sensor is complete. This is omitted from the subsequent figures, but the process continues with the element height pattern in the perpendicular direction being processed for the tracks using a similar procedure, and permalloy is deposited as the upper magnetic shield layer, after which the recording head is formed on top of the read head without further treatment, according to one embodiment. It should be noted that the element height pattern is processed first, and then the track width pattern is processed, according to one embodiment.

Figure 5:
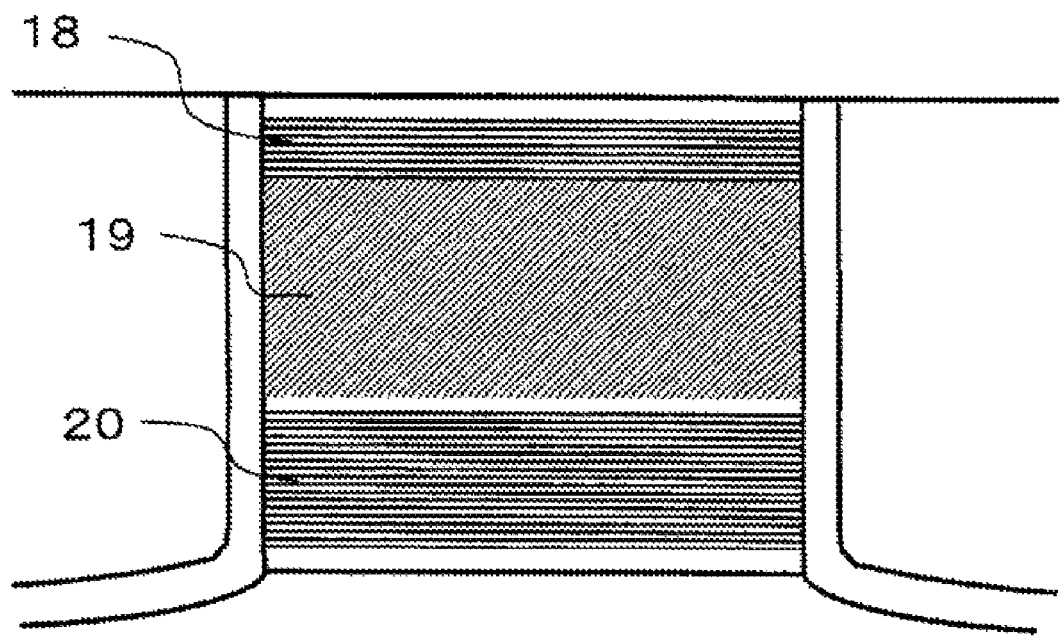
FIG. 5 schematically illustrates the structure of an MAMR element, according to the prior art.

A simple description is given next regarding the case of an MAMR element. The film structure of the MAMR element is as shown in FIG. 5, and various kinds of structures have been proposed, but it may comprise a reference layer 20 for producing a spin polarization current, a microwave generation layer 19 (FGL, field generation layer), and several auxiliary layers. The auxiliary layers depend on the configuration, but comprise layers for fixing the magnetization orientation, among others, or they may not be used. The microwave generation layer 19 should be thick enough to output an AC magnetic field in order to achieve a sufficient effect in assisting the recording field, and specifically it has been estimated that the thickness may be around 25 nm. If the thickness of the reference layer is about 10 nm-20 nm, and the thickness of the auxiliary layers is about 5 nm-10 nm, the total thickness of the MAMR element is about 40 nm-55 nm. The taper height of the flared portion depends on the ion milling conditions, but it may be less than about 0 nm-20 nm. If this relationship is determined using FIG. 16, it can be understood that x≧2k is achieved, corresponding to the void/seam formation region (C). This means that no void or seam is formed in the film embedded in the side wall in the MAMR element, in the same way as for the previous differential read head, and from this point of view the issue addressed is the same.

In view of these issues, according to one embodiment, a production method is provided whereby voids or seams are not formed in refill films after patterning of thick elements having a film thickness of about 40 nm-80 nm, such as differential read heads and MAMR elements. Also a differential read head and an MAMR element produced by the method are provided, according to one embodiment.

Figure 18:
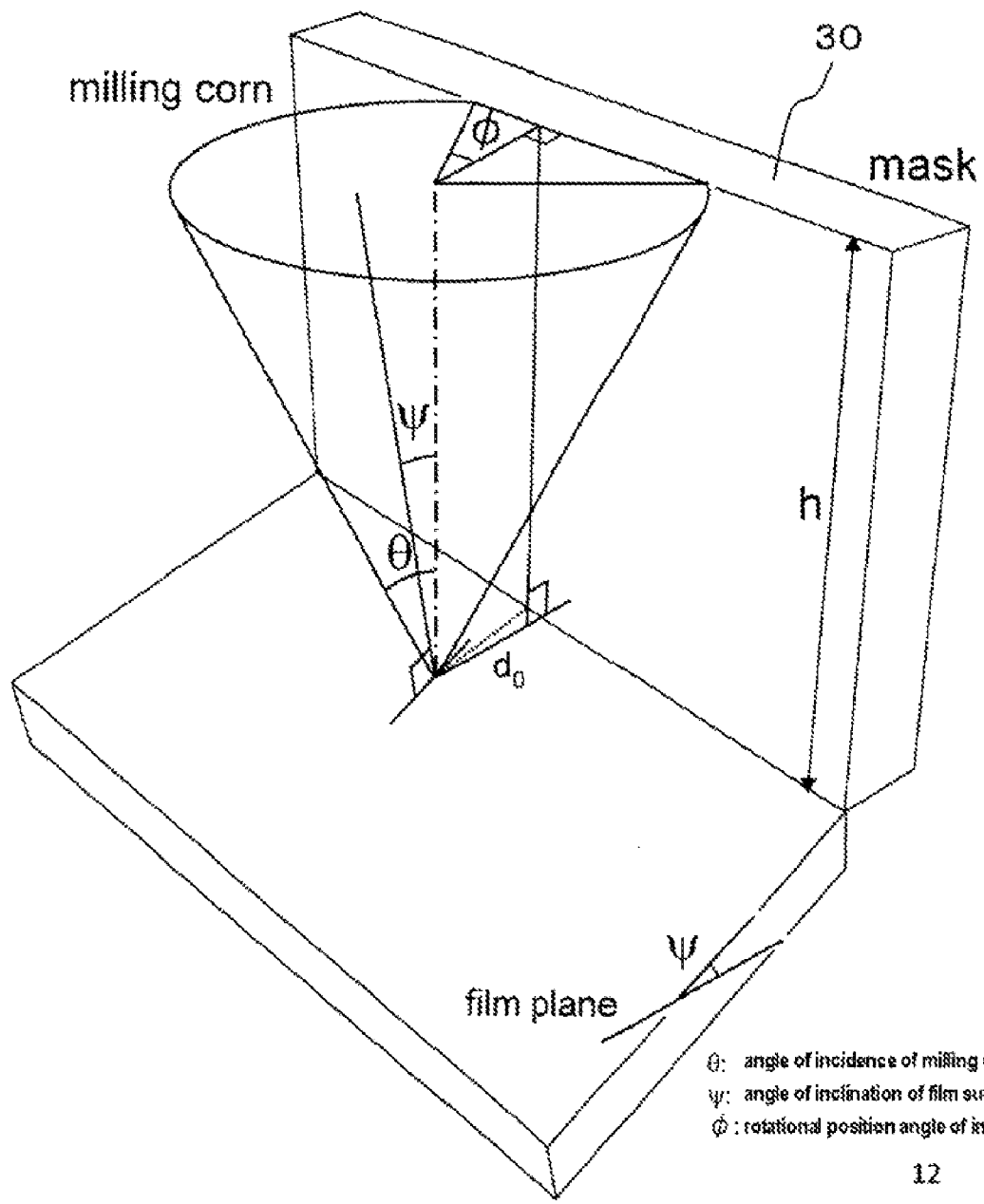
FIG. 18 schematically illustrates an amount of reduction in ion milling of the pattern side wall region, according to one embodiment.

A description is now given of one reason why the film thickness in the pattern side wall region after ion milling is half of the thickness of the planar portion, according to one embodiment. When ion milling is employed, the magnetoresistive film, etc., is removed by argon ions or the like which are incident at the ion angle of incidence θ which is defined by taking as a reference the substrate normal direction with respect to the pattern 30, as shown in FIG. 18. The substrate is rotated through 360° at a constant speed with the normal direction as the axis. If θ is defined, the ion milling rate is determined simply by the amount of incidence of the ions, and therefore the milling rate is reduced in proportion to the time for which the ions are blocked to form a shadow during a single rotation of the substrate. If the angle in the range where the cone having a tip end angle which is the angle of incidence θ is not blocked by the pattern is φ (rad), as shown in FIG. 18, then the milling rate at a point a distance $d_0$ from the pattern is φ/2π times that of the planar portion, according to one embodiment. Shadowing occurs in the pattern region for exactly half of the time, so φ=π, and therefore the milling rate is also halved.

To resolve the issues outlined above, a series of production processes may be employed in the refill film deposition step after patterning of the magnetic multilayer including the following steps: a first stage deposition step, then a step in which the deposited film is etched back, and a second stage deposition step.

Figure 19:
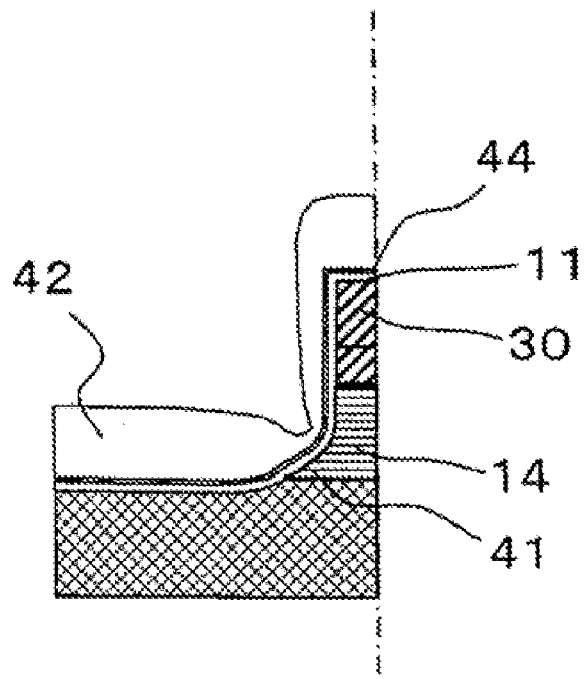
FIG. 19 illustrates a first exemplary embodiment of a portion of a magnetic head.
Figure 20:
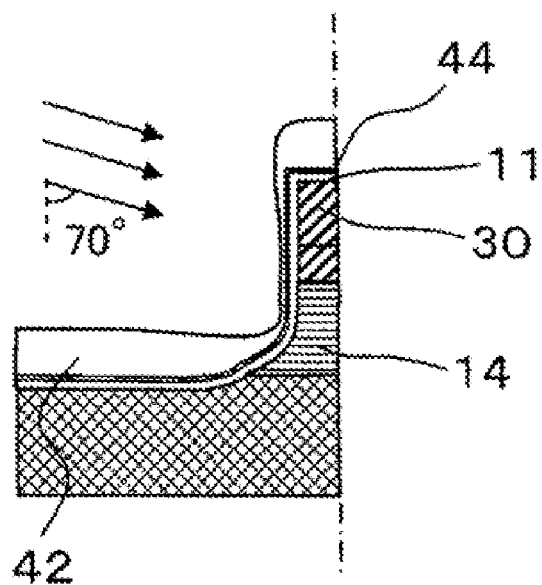
FIG. 20 illustrates the first exemplary embodiment of a portion of a magnetic head.

As shown in FIG. 19, the first stage deposition step may be carried out by ion beam deposition up to a film thickness such that voids/seams are not formed, with the deposition thickness being x<2k. After this, etching back is carried out to about ⅒-½ of the deposited film. The etching back may be carried out using ion beam milling with the angle of incidence set at oblique incidence conditions of 70°±10° from the substrate normal direction. In this way, the speed of removal of the side walls from the planar portion is increased, and it is possible to suppress the formation of voids and seams in the deposition step in which the open angle from the side wall region continues to widen. The shape after the etching back is shown in FIG. 20. After this, the second stage deposition step is performed in which the process for forming the refill film without voids or seams shown in FIG. 1 is completed. The deposition thickness in the second stage may be increased up to the point at which the total thickness of the refill film reaches the thickness of the magnetic multilayer film 14, or the refill film, is formed to be slightly thicker, taking account of the margin which is removed in the subsequent steps, according to one embodiment.

According to one embodiment, it is possible to suppress the formation of voids and seams, and therefore it is possible to suppress deterioration in the hard bias field strength and coercive force. It is also possible to apply a magnetic field in accordance with the design to a thick magnetic multilayer film element such as a differential read head, according to one embodiment.

The first exemplary embodiment is described below. This exemplary embodiment is the same as the method which was described previously, from the stage in which the track width pattern is formed by photolithography, as previously shown in FIG. 8, during a process for producing a wafer for a differential playback magnetic head, up to the step in which the magnetoresistive film 14 having a thickness of about 60 nm is removed by ion milling. Following this, a thin alumina film 11 may be deposited to about 4 nm as an insulating film by sputtering, after which the state in FIG. 19 is achieved in which a chromium/molybdenum film (CrMo) is deposited as an orientation underlayer 44, and a first hard bias film 42 is deposited by means of an ion beam deposition device. The first hard bias film is provided on both sides in the track width direction of the magnetoresistive film 14. A hard magnetic film made of cobalt/chromium/platinum (CoCrPt) is used for the first hard bias film 42. It should be noted that the hard bias film is not limited to CoCrPt, and another material may be used, provided that it is a hard magnetic material to which the magnetic field can be applied. Furthermore, an orientation underfilm, such as CrMo, may preferably be deposited to about 2 nm-4 nm in order to control the crystal orientation in the layers below the hard bias film. In this instance, CrMo is deposited to 3.5 nm. Depending on the case, an amorphous layer such as tantalum (Ta) or nickel/tantalum (NiTa) which includes a crystalline reset layer may be deposited to about 1 nm-2 nm as a further base below the orientation underfilm. In this instance, CoCrPt is deposited to 45 nm on the orientation underlayer. The film thickness must satisfy the relationship of x<2k in the relationship in FIG. 16 whereby voids/seams are not formed. The height (k) of the flared portion 41 of the magnetoresistive film 14 is 25 nm, and the reference relationship of film deposition thickness x=45 nm<2k=50 nm is certainly satisfied.

In addition, the ion milling conditions of the magnetoresistive film 14 for the thick-film differential read head may be split into unit sets comprising an ion milling step at an angle of incidence of 30°±10°, followed by an ion milling step under side-wall reattachment and removal conditions at an angle of incidence of 70°±10°, and a plurality of sets are repeated in such a way that the half-taper disclosed in Japanese Unexamined Patent Appl. Pub. No. 2009-26400 is formed. In this method, the widths of the magnetic sensor films (free layers 23 and 25 in FIG. 7) of the two elements for causing differential operation may be made equal, and the height (k) of the flared portion may be formed to the desired shape.

Next, the hard bias film is etched back, according to one embodiment. The first hard bias film 42 corresponding to 15 nm is removed at the planar portion by ion milling at an angle of incidence of 70°±10°. In this process, the side wall parts of the magnetoresistive film 14 are removed by twice this amount, around 30 nm, although this depends on the equipment and conditions, and therefore the shape after etching back assumes the state shown in FIG. 20, and the open angle from the corner part of the side wall becomes wider, and voids/seams are less likely to be formed, according to one embodiment. The side wall removal rate generally increases up to around twice that of the planar portion in the case of ion milling under oblique incidence with an angle of incidence of around 70°, and therefore the amount of removal in this etching back step should be set at a maximum of 50% of the thickness of the first hard bias film in terms of the planar portion. In this process, it is possible to prevent the side wall hard bias film from being eliminated and damage being caused to the insulating film 11 and magnetoresistive film 14. In many cases, the side wall is thinner than the planar portion during deposition, and therefore the practical upper limit for the amount of etching back is even lower than 50%.

The etching back is carried out by ion milling in a different chamber of the ion beam deposition device to the one in which the first stage hard bias film was deposited. This prevents a drop in throughput caused by reintroducing a vacuum. In addition, the subsequent second hard bias film is also deposited using an ion beam deposition chamber in the same device. The undesirable effects of oxide film formation, etc., which is caused by exposure to the atmosphere, are prevented by joining the areas between treatments and conveying products between vacuum chambers, and the throughput can also be improved. It should be noted that it is not impossible to employ a device which does not have a plurality of chambers for ion beam deposition and ion milling. A method capable of this is described in the next exemplary embodiment.

After the etching back, a film that does not impair magnetic characteristics may be formed by depositing the second hard bias film while a vacuum is still maintained. FIG. 1 shows a state in which a CoCrPt film of thickness 35 nm is deposited as the second hard bias film 43. The total thickness of the hard bias films deposited in the steps until this point is designed so as to be thicker than the magnetoresistive film 14 at the planar portion. That is to say, considering the amount (x) of the first hard bias film deposited, the etching back amount (y), and the amount (z) of the second hard bias film deposited, each thickness of film is basically designed in such a way that x−y+z≧thickness of the magnetoresistive film, according to one embodiment. The total thickness of the hard bias film is preferably formed to be slightly thicker than the thickness of the magnetoresistive film in order to take account of the margin which is removed in the subsequent CMP step, according to one embodiment. On the other hand, the final film thickness of the hard bias film is designed in such a way that the strength of the hard bias field applied to the magnetoresistive film 14 is appropriate, and the optimum processing conditions are determined in consideration of these points, according to one embodiment.

Figure 2:
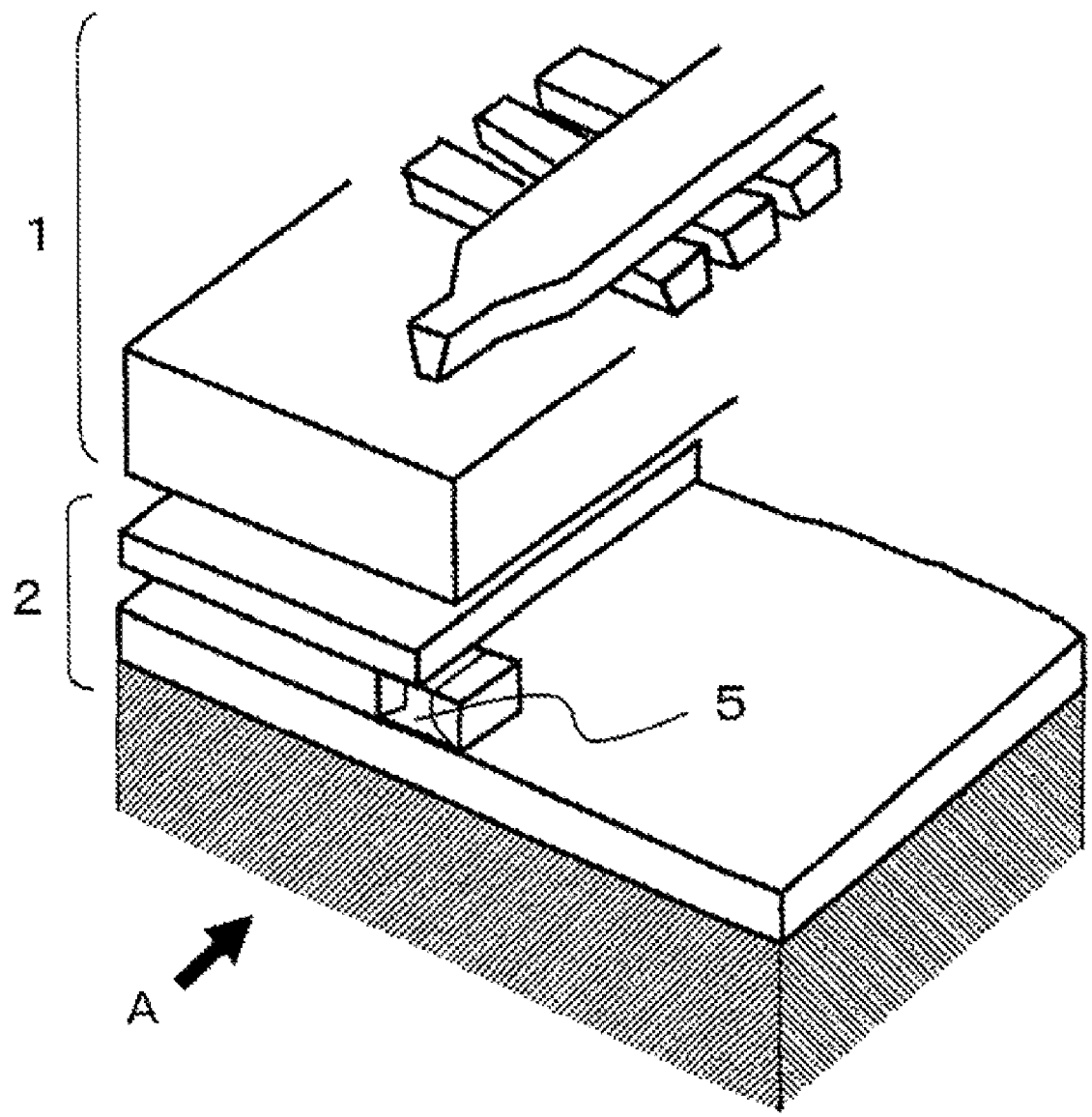
FIG. 2 schematically illustrates a separate recording/playback-type head, according to the prior art.
Figure 3:
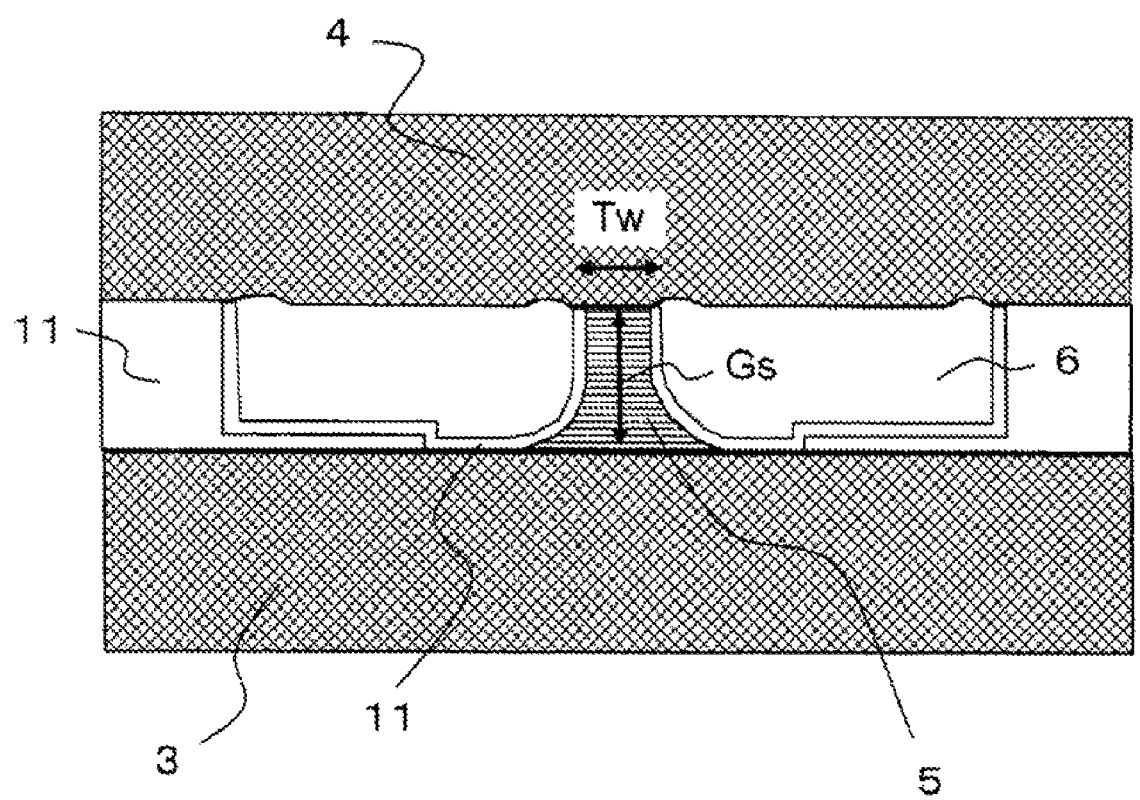
FIG. 3 illustrates an enlarged cross section of the playback magnetic head portion, according to the prior art.
Figure 4:
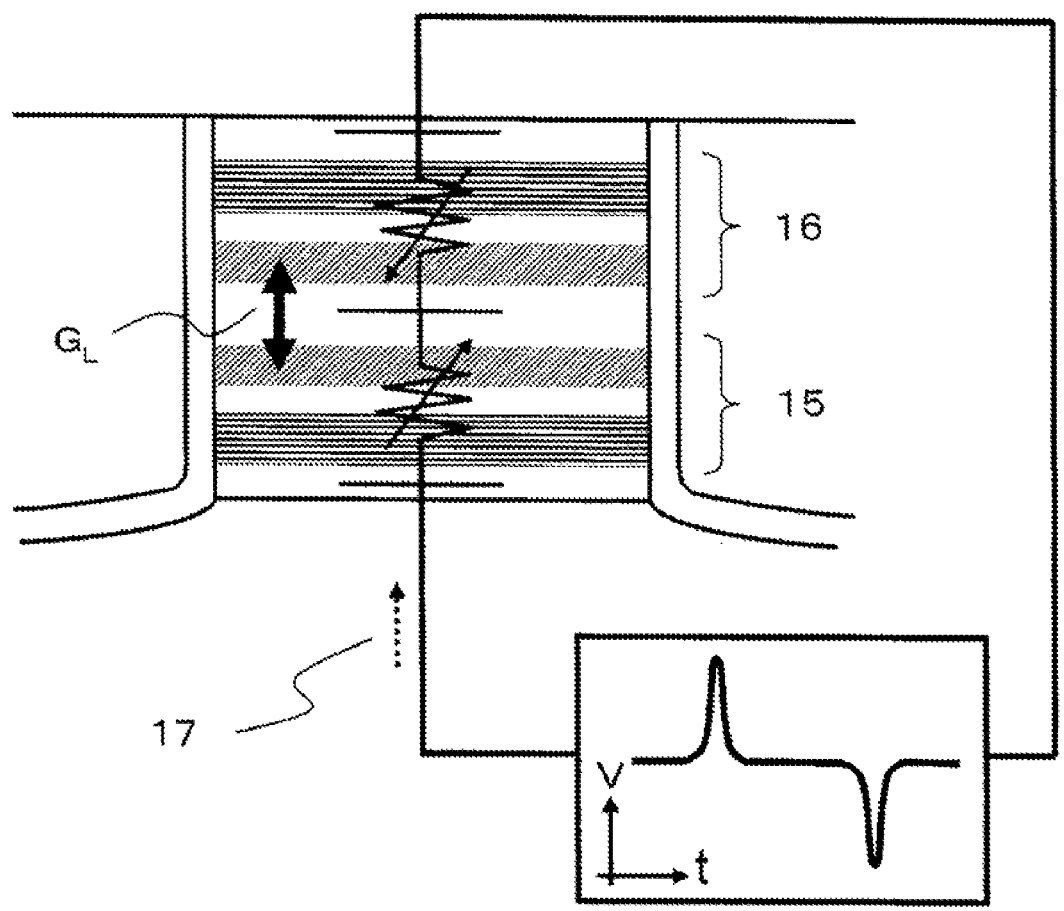
FIG. 4 illustrates the structure of the differential playback magnetic head and an equivalent circuit, according to the prior art.
Figure 21:
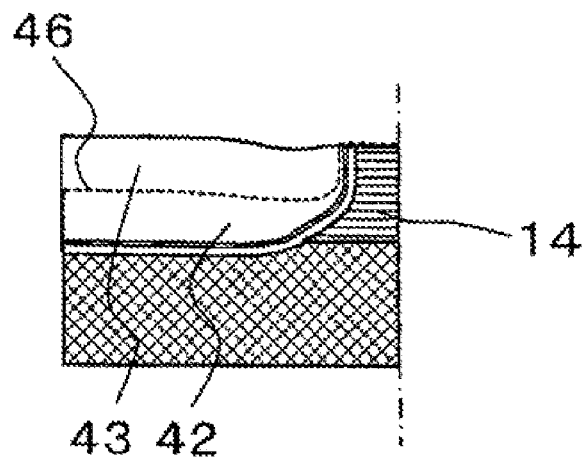
FIG. 21 illustrates the first exemplary embodiment of a portion of a magnetic head.

After this, the production process is the same as for a conventional magnetic head. The state shown in FIG. 21 is achieved when the laminated resist 30 on top of the magnetoresistive film and the insulating film 11 and hard bias films 42, 43 are removed by means of CMP lift-off, and the basic structure of the magnetic read head is complete, according to one embodiment. In the figures, 46 is the interface between the first hard bias film 42 and the second hard bias film 43. Following this, the process continues with permalloy being deposited as the upper magnetic shield layer which also serves as an electrode, after which the recording head is formed on top without further treatment, and the magnetic head shown in FIG. 2 is complete, according to one embodiment.

According to the inventive method for producing a magnetic head, it is possible to suppress the formation of voids and seams, and therefore it is possible to suppress deterioration in the hard bias field strength and coercive force, according to one embodiment. It is also possible to apply a magnetic field in accordance with the design to a thick magnetic multilayer film element such as a differential read head, according to one embodiment. Furthermore, an effect is achieved whereby it is possible to prevent corrosion of the metallic magnetic film in the subsequent stages due to lift-off or CMP, or the ingress of cleaning fluid into a void or seam.

Figure 22:
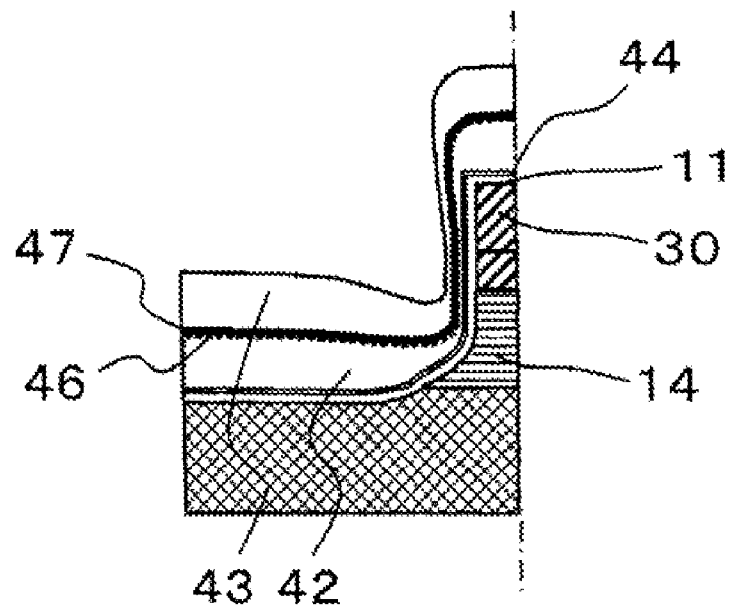
FIG. 22 illustrates a second exemplary embodiment of a portion of a magnetic head.

The second exemplary embodiment is now described. In this exemplary embodiment, a method is described in which an orientation control film is re-inserted underneath. The stages up to where the first hard bias film 42 is etched back, shown in FIG. 20, are the same as in the first exemplary embodiment. After this, and prior to the deposition of the second hard bias film, a CrMo film is deposited to about 3.5 nm as an orientation underfilm for controlling the second crystal orientation. This film is the same as that used as the first orientation underfilm before the first hard bias film is deposited. The CrMo film may be formed in the same chamber of the ion beam deposition device as is used for depositing the CoCrPt hard bias film, and therefore there is virtually no change in the throughput of the process. After a second orientation underfilm 47 has been formed, the second hard bias film 43 is deposited to reach the state shown in FIG. 22. After this, the magnetic head may be completed via the same process as in the first exemplary embodiment.

Thus, according to various embodiments, the orientation underfilm for controlling the crystal orientation may be inserted before the second hard bias film is deposited by splitting the hard bias film deposition into two stages, and the coercive force of the hard bias film may be increased. The orientation underfilm which is inserted before the second hard bias film is deposited may be the same as the orientation underfilm which is inserted before the first hard bias film is deposited. For example, if CoCrPt hard bias films of total thickness 65 nm are stacked, the coercive force obtained is only 1130 oersted, which is lower than the 1400 oersted in the case of a normal spin valve of thickness 21 nm, but when the orientation underfilm is re-inserted before the second hard bias film is deposited, the coercive force which can be achieved is 1350 oersted, which is virtually the same as when the film is thin. As a result of the increase in coercive force it is possible to improve the stability of the hard bias, according to one embodiment.

The same film may preferably be used for both the first hard bias film and second hard bias film. In this process, films may be continuously formed in the same ion beam deposition device, in addition to managing the magnetic characteristics so that they achieve the same state. Differential read heads are utilized in an equal manner, and therefore the hard bias field which is applied to the two magnetic sensor films is preferably the same, and this means that the type of film used for the first and second hard bias films is also set taking this into account, according to one embodiment. On the other hand, if there is a large difference in the thickness of the first and second hard bias films and the hard bias field is to be arranged, the type of film used for the first and second hard bias films may be changed so as to provide a difference in magnetization, which makes it possible to set the magnetic field using different film thicknesses. Furthermore, when there is a difference in the dimensions of the two magnetic sensor films in the differential read head, and when a difference in the two hard bias fields is to be provided intentionally, it is effective to change the type of film used for the first and second hard bias films so as to provide a difference in magnetization.

Figure 23:
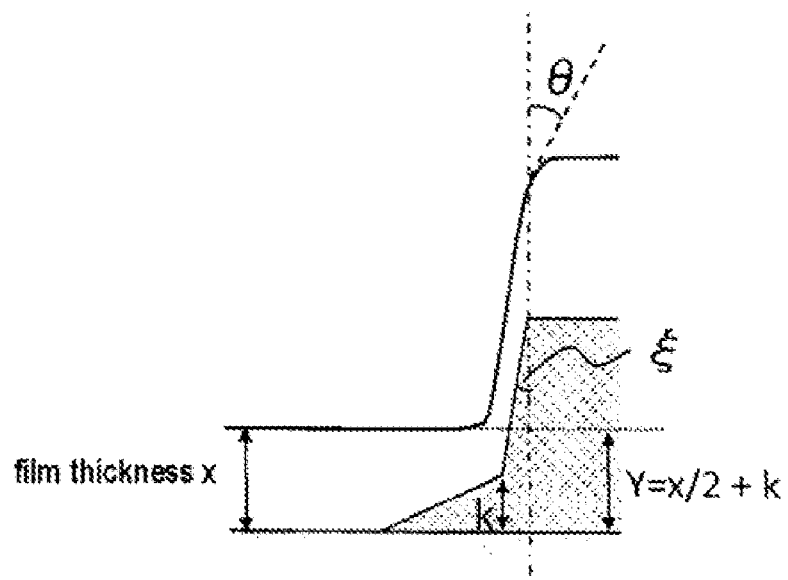
FIG. 23 illustrates a case in which a slight taper is formed on the side wall, according to one embodiment.

Until this point it has been assumed that in the case described above, the surface constituting the side wall of the magnetoresistive element 14 (the surface not including the flared portion) is perpendicular to the substrate. In practice, when processing is carried out using ion milling, it is simple to form a slight taper on the side wall. A taper may also be formed to a certain extent even if use is made of RIE (reactive ion etching) which makes it simple to form perpendicular walls. FIG. 23 is a view in cross section showing a case in which a slight taper is formed on the side wall. If the side wall taper angle is $\xi$, then when the ion milling angle of incidence $\theta$ is such that $\theta > \xi$ and the taper angle $\xi$ is small, it can be considered that the relationship between the cone and the mask 30 representing the trajectory of the angle of incidence for the ion milling shown in FIG. 18 is largely the same relationship as in the case when the side wall is perpendicular. That is to say, using the angle $\phi$ in the range where the cone representing the trajectory of the angle of incidence defined in FIG. 18 is blocked by the mask, the milling rate is $\phi/2\pi$ times that of the planar portion, and about half that of the planar portion in the side wall region. Furthermore, when the angle of incidence $\theta$ of the ion milling is in the range of $\theta < 20°$, it is known that there is a large amount of reattachment to the side wall during milling, and it is not usual to use the condition of making $\theta$ smaller than this on its own. In view of the above, the method according to one embodiment, may have a substantial effect provided that the side wall taper angle $\xi$ is in the range of $\xi < 20°$.

Figure 24:
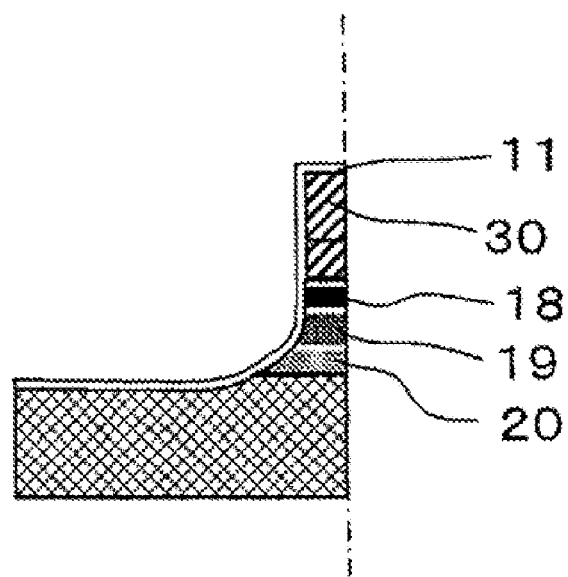
FIG. 24 illustrates a third exemplary embodiment of a portion of a magnetic head.
Figure 28:
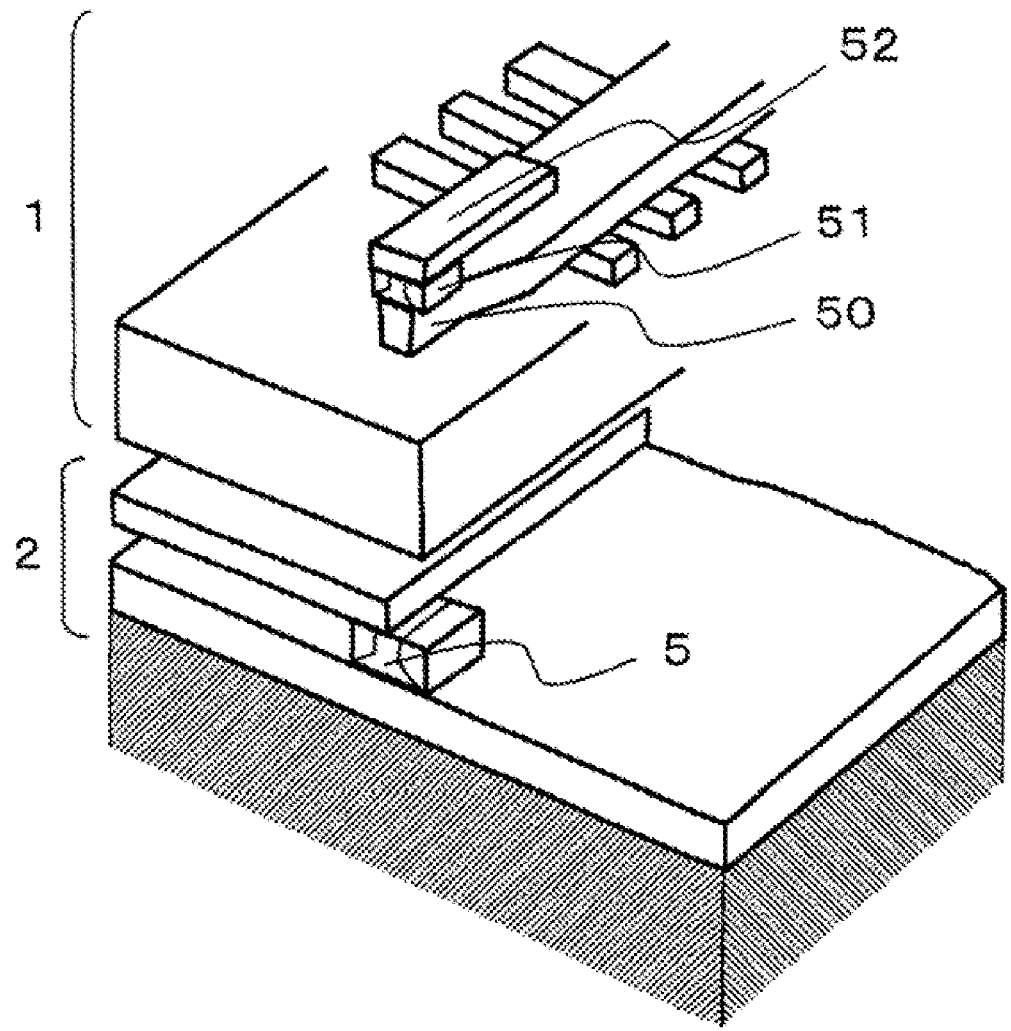
FIG. 28 illustrates a structure of an energy-assisted magnetic head, according to one embodiment.

Lastly, the third exemplary embodiment is described. In this exemplary embodiment, an MAMR element is used instead of the differential read head in the previous exemplary embodiments. The MAMR element is a microwave-generating element for energy-assisted magnetic recording, and it is formed in the region of the writing pole (main pole) of the recording head, according to one embodiment. FIG. 28 shows the whole of the energy-assisted magnetic head which employs the MAMR element. An MAMR element 51 is disposed adjacent to and between a main pole 50 and a rear end side (trailing side) shield 52. Microwaves from the MAMR element 51 induce precession of the medium magnetization, thereby assisting in the required magnetization inversion of the write field from the main pole 50. It should be noted that the MAMR element may be disposed at the front end side (leading side), but in any event writing is performed in the area where the magnetic field from the main pole and the microwaves are overlapping, and therefore the two must be close together. The cross section of the MAMR element is as already shown in FIG. 5, and the magnetic multilayer film of the MAMR element seen from the ABS when the wafer substrate surface is facing downward comprises the reference layer 20, the microwave generation layer (FGL) 19, and the auxiliary layer 18. FIG. 24 shows a state in which the magnetic multilayer film remains only in the track width portion and is removed by means of ion milling, and alumina is then deposited to 4 nm as the insulating film 11. After this, a hard magnetic film for applying a hard bias is deposited, but the film is too thick if it is formed on a single occasion, which causes voids or seams, so the film is formed in two stages.

Figure 25:
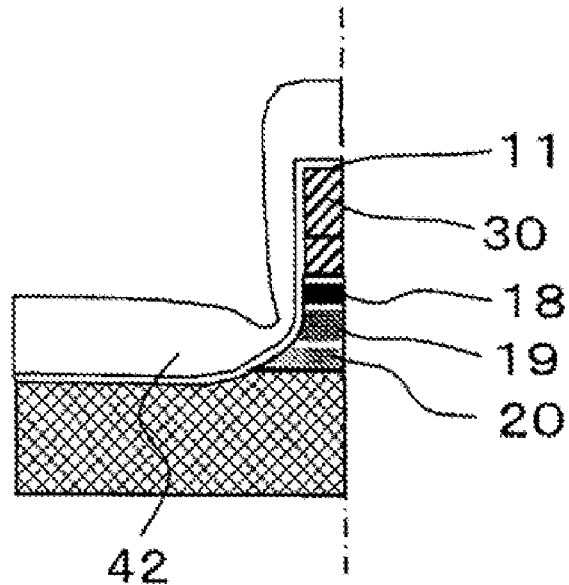
FIG. 25 illustrates the third exemplary embodiment of a portion of a magnetic head.
Figure 26:
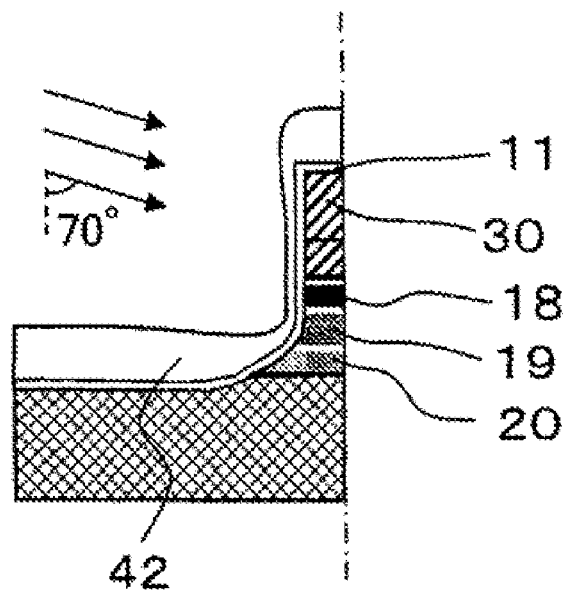
FIG. 26 illustrates the third exemplary embodiment of a portion of a magnetic head.
Figure 27:
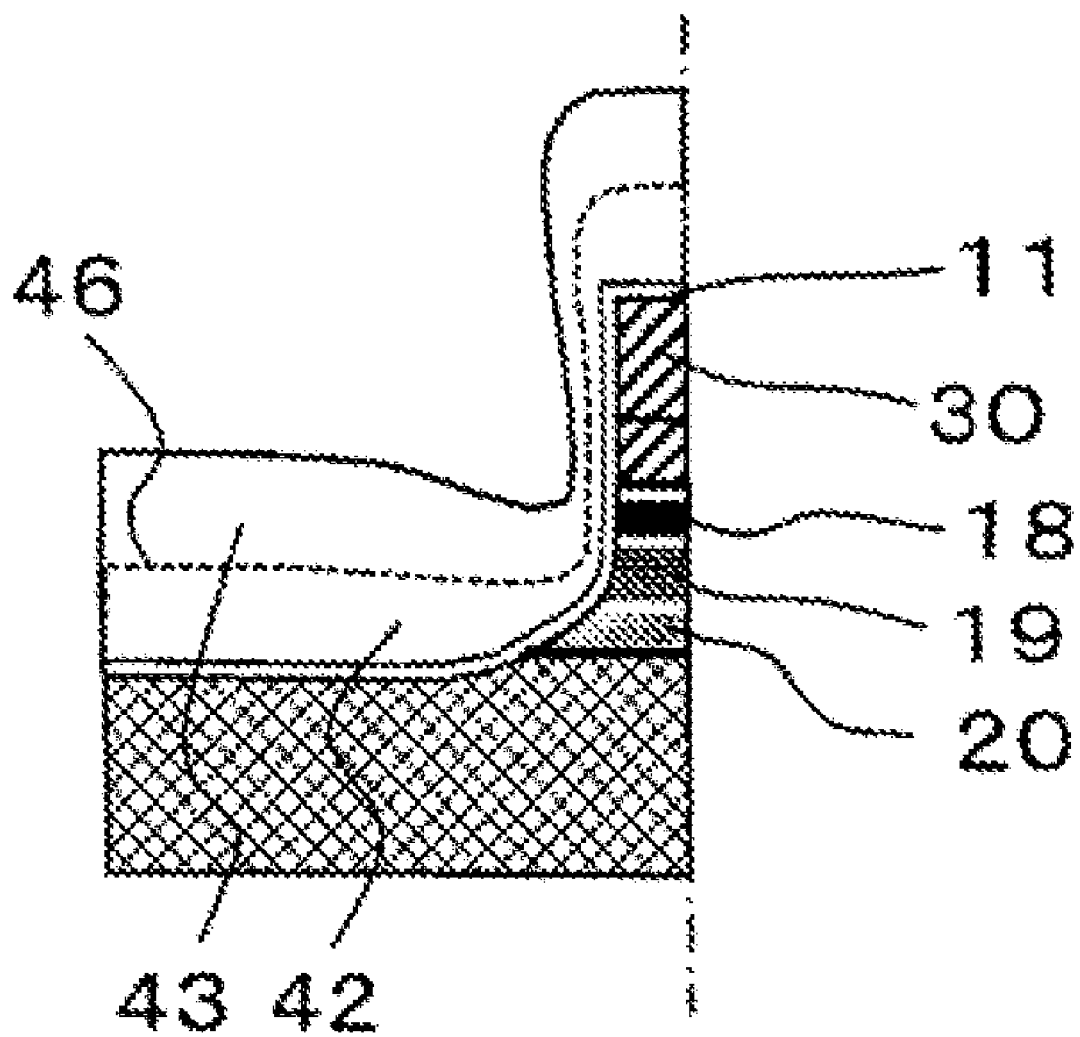
FIG. 27 illustrates the third exemplary embodiment of a portion of a magnetic head.

FIG. 25 shows the initial stage in which the first hard bias film 42 is deposited to 45 nm, FIG. 26 shows said film being subjected to etching back, and FIG. 27 shows the state when the second hard bias film 43 is deposited, according to various embodiments.

It should be noted that in this instance the hard bias film is deposited adjacent to the magnetic multilayer film, but depending on the design of the MAMR element, it is equally possible to use, as the adjacent film, a non-magnetic insulating film (for example alumina), or a soft magnetic shield material (for example permalloy), or a suitable combination thereof. After this, the laminated resist 30 on top of the magnetic multilayer film and the insulating film 11 and hard bias films 42, 43 are removed by means of CMP lift-off, and a pole for a normal recording head is formed directly on the MAMR element, according to one embodiment.

Embodiment that have been disclosed above may include additional aspects not specifically described, and the present invention is not limited to the cases described above, as it can equally be applied to a similar production method in which a refill film adjacent to a thick magnetic multilayer film is formed without voids/seams in such a way that the relationship between the deposited film thickness x and the taper height k of the flared portion satisfies x>2k, and the invention may equally be applied in relation to a magnetic head which employs the same, according to one embodiment.

The present invention may be applied to the production of magnetic heads for magnetic disks, and especially of high-resolution magnetic sensors which employ a magnetoresistive element, and of microwave-assisted magnetic recording heads which employ a magnetic film.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A method for producing a magnetic head, the method comprising:
    depositing a first film above a substrate;
    etching a pattern into the first film;
    depositing a second film on the etched portion of the first film; and
    depositing a third film above the first and second film to form a multilayer magnetic film, wherein the second film is embedded between the first film and the third film in a portion of the first film that is removed,
    wherein a taper height (k) of a side wall flared portion of the multilayer magnetic film and an overall thickness (x) of the first film and second film at a planar portion adhere to x>2k.

2. The method for producing a magnetic head as recited in claim 1, wherein the second film is a hard magnetic film for controlling a magnetic domain of the multilayer magnetic film.

3. The method for producing a magnetic head as recited in claim 2, wherein the first film and the second film are identical types of films.

4. The method for producing a magnetic head as recited in claim 2,
    wherein the first film comprises:
        a first orientation underlayer;
        a first hard magnetic layer deposited on the first orientation underlayer; and
    wherein the second film comprises:
        a second orientation underlayer; and
        a second hard magnetic layer deposited on the second orientation underlayer.

5. The method for producing a magnetic head as recited in claim 4, wherein the first film and the second film are identical types of films.

6. The method for producing a magnetic head as recited in claim 1, wherein a primary side wall of the multilayer magnetic film is perpendicular or has an angle of inclination of no more than about 20° from perpendicular to a surface of the substrate.

7. The method for producing a magnetic head as recited in claim 6,
    wherein the first film comprises:
        a first orientation underlayer;
        a first hard magnetic layer deposited on the first orientation underlayer; and
    wherein the second film comprises:
        a second orientation underlayer; and
        a second hard magnetic layer deposited on the second orientation underlayer.

8. The method for producing a magnetic head as recited in claim 6, wherein the first film and the second film are identical types of films.

9. The method for producing a magnetic head as recited in claim 8,
    wherein the first film comprises:
        a first orientation underlayer;
        a first hard magnetic layer deposited on the first orientation underlayer; and
    wherein the second film comprises:
        a second orientation underlayer; and
        a second hard magnetic layer deposited on the second orientation underlayer.

10. The method for producing a magnetic head as recited in claim 6, wherein the first film and the second film are identical types of films.

11. The method for producing a magnetic head as recited in claim 1,
    wherein the first film comprises:
        a first orientation underlayer;
        a first hard magnetic layer deposited on the first orientation underlayer; and
    wherein the second film comprises:
        a second orientation underlayer; and
        a second hard magnetic layer deposited on the second orientation underlayer.

12. The method for producing a magnetic head as recited in claim 1 wherein the first film and the second film are identical types of films.

13. The method for producing a magnetic head as recited in claim 1, wherein the first film the second film are identical types of films.

14. The method for producing a magnetic head as recited in claim 1, wherein an amount of etching of the first film is no more than about 50% of an overall thickness of the first film at a planar portion of the first film.

15. A differential magnetic read head, comprising:
    a magnetic multilayer film comprising a stack of a first magnetic sensor film and a second magnetic sensor film which are not magnetically connected; and
    a hard magnetic film provided on both sides in a track width direction of the magnetic multilayer film for controlling a magnetic domain of the magnetic multilayer film, the hard magnetic film being a laminated structure comprising:

a first embedded film having a film surface that has been etched back; and a second embedded film deposited on the film surface that has been etched back on the first embedded film;

wherein differential signals of the first magnetic sensor film and the second magnetic sensor film are output, and wherein a taper height (k) of a side wall flared portion of the magnetic multilayer film and an overall thickness (x) of the first embedded film and the second embedded film at a planar portion adhere to x>2k.

16. The differential magnetic read head as recited in claim 15, wherein a primary side wall of the magnetic multilayer film is perpendicular or has an angle of inclination of no more than about 20° from perpendicular to a surface of a substrate.

17. The differential magnetic read head as recited in claim 15, wherein the first embedded film comprises:
  a first orientation underlayer;
  a first hard magnetic layer deposited on the first orientation underlayer; and wherein the second embedded film comprises:
  a second orientation underlayer; and
  a second hard magnetic layer deposited on the second orientation underlayer.

18. The differential magnetic read head as recited in claim 15, wherein the first embedded film and the second embedded film are identical types of films.

19. The differential magnetic read head as recited in claim 15, wherein an amount of etching of the first embedded film is no more than about 50% of an overall thickness of the first embedded film at a planar portion of the first embedded film.

20. A magnetic data storage system, comprising:
  at least one differential magnetic read head as recited in claim 15;
  a magnetic medium;
  a drive mechanism for passing the magnetic medium over the at least one differential magnetic read head; and
  a controller electrically coupled to the at least one differential magnetic read head for controlling operation of the at least one differential magnetic read head.

21. An energy-assisted magnetic recording head, comprising:
  a multilayer magnetic film having a laminated structure comprising at least:
    a first magnetic layer for generating a spin polarization current; and
    a second magnetic layer for generating microwaves using spin torque of a spin polarization current;
  a pole for generating a recording field; and
  an embedded film formed adjacent to the multilayer magnetic film,
  wherein the embedded film has a laminated structure comprising:
    a first embedded film in which a film surface has been etched back; and
    a second embedded film deposited on the film surface that has been etched back on the first embedded film.

22. The energy-assisted magnetic recording head as recited in claim 21, wherein the first film comprises:
  a first orientation underlayer;
  a reference layer deposited on the first orientation underlayer; and wherein the second film comprises:
  a second orientation underlayer; and
  a microwave-generating layer deposited on the second orientation underlayer.

23. The energy-assisted magnetic recording head as recited in claim 21, wherein a taper height (k) of a side wall flared portion of the multilayer magnetic film and an overall thickness (x) of the first embedded film and the second embedded film at a planar portion adhere to x>2k.

24. The differential magnetic read head as recited in claim 21, wherein an amount of etching of the first embedded film is no more than about 50% of an overall thickness of the first embedded film at a planar portion of the first embedded film.

25. A magnetic data storage system, comprising:
  at least one energy-assisted magnetic recording head as recited in claim 21;
  a magnetic medium;
  a drive mechanism for passing the magnetic medium over the at least one energy-assisted magnetic recording head; and
  a controller electrically coupled to the at least one energy-assisted magnetic recording head for controlling operation of the at least one energy-assisted magnetic recording head.

* * * * *